United States Patent [19]
Watkinson et al.
[11] 3,715,210
[45] Feb. 6, 1973

[54] LITHOGRAPHIC PRINTING PLATES

[75] Inventors: Leonard J. Watkinson, Leeds; Anthony Peter Service, Selby, both of England

[73] Assignee: Howson-Algraphy Limited, London, England

[22] Filed: Feb. 19, 1971

[21] Appl. No.: 117,079

Related U.S. Application Data

[63] Continuation-in-part of Ser. No. 742,495, July 5, 1968, abandoned.

[30] Foreign Application Priority Data

| | | |
|---|---|---|
| Aug. 18, 1966 | Great Britain | 37,135/66 |
| Aug. 17, 1967 | Italy | 38841 A/67 |
| July 1, 1968 | Italy | 38080 A/68 |
| July 3, 1968 | Norway | 3274 |
| July 3, 1968 | Norway | 2667 |
| July 3, 1968 | Sweden | 9143/68 |
| July 4, 1968 | Australia | 6416 |
| July 4, 1968 | South Africa | 4301 |

[52] U.S. Cl. ....................96/33, 96/75, 96/91 R, 96/91 D, 96/91 N
[51] Int. Cl. ..........G03f 7/02, G03c 1/52, G03c 1/64
[58] Field of Search .......96/33, 75, 91 R, 91 D, 91 N

[56] References Cited

UNITED STATES PATENTS

| | | | |
|---|---|---|---|
| 3,287,128 | 11/1966 | Lugasch | 96/33 |
| 2,246,425 | 6/1941 | Von Poser et al. | 96/91 R X |
| 2,692,826 | 10/1954 | Neugebauer et al. | 96/91 N X |
| 3,479,182 | 11/1969 | Chu | 96/33 |
| 2,702,243 | 2/1955 | Schmidt | 96/91 D X |
| 2,687,958 | 8/1954 | Neugebauer | 96/91 N |

*Primary Examiner*—David Klein
*Attorney*—Stevens, Davis, Miller & Mosher

[57] ABSTRACT

A light sensitive plate comprises a support coated with a layer comprising a tannable resin and a diazo or azido compound having light decomposition products capable of tanning the resin. The tannable resin is low viscosity hydroxyethyl cellulose or a polymer of acrylamide and at least two other monomers containing up to 30 percent by weight of the other monomers. The monomers are selected so that the layer does not swell on development. The light sensitive plate is storage stable and is suitable for the production of half-tone lithographic printing plates by the deep-etch process.

8 Claims, No Drawings

LITHOGRAPHIC PRINTING PLATES

This application is a continuation-in-part application of our application Ser. No. 742,495 filed on the July 5, 1968, now abandoned.

This invention relates to presensitized light sensitive plates for producing lithographic printing plates.

A known method of preparing lithographic printing plates is the "deep-etch process" which comprises applying a water-soluble light-sensitive coating thinly to a grained aluminum support, exposing the coated plate under a positive to actinic radiation, and thereafter developing with a suitable developer which removes the non-light-struck areas of the coating to reveal the surface of the support underlying these areas but which leaves on the support a layer of hardened coating in those areas which were irradiated. Those areas of the support surface revealed on development are then etched with an etching solution for a short time and thereafter coated with an ink-receptive lacquer. These lacquered areas constitute the printing areas of the eventual plate. Finally, the hardened coating is removed from the support. The areas of the support surface thereby revealed constitute the non-printing areas of the printing plate.

Light sensitive plates suitable for processing by the above process can be made from, for example, zinc, aluminum, aluminum which has been anodized to give a wear-resistant water-receptive oxide surface, or bimetal plates, and typical examples of light-sensitive coatings are aqueous solutions of gum arabic or polyvinyl alcohol sensitized with ammonium dichromate. Coatings of this type have, however, serious disadvantages in that once the support has been coated and dried, an overall hardening action known as the "dark reaction" sets in, rendering the coating generally insoluble in water and thus incapable of forming areas of different solubility on image-wise exposure. The time taken for such a coating to become unusable varies with the type of sensitizer used and the conditions of storage, particularly temperature and humidity, but is not normally longer than a few days.

There are plates in use at the present time known as "presensitized plates" which comprise a support coated with a light-sensitive resin. After exposure of such plates to light under a positive or negative, depending on the type of resin, and after suitable development, an image capable of printing immediately is formed on the surface of the support. These plates possess light-sensitive coatings which are stable for long periods of time, but as the image produced is on the surface of the plate this type of plate is more subject to wear and thus does not produce as many copies as plates produce by the "deep-etch" process described above.

Certain resins are capable of being made less soluble (i.e. tanned) under the action of light by the presence of a sensitizing agent so that by the choice of a suitable developing agent the non-light-struck areas of the coating may be selectively removed. However, not all of these resins have sufficient resistance to the acids and chemicals used in the etching solutions thereby causing a deterioration of the quality of the image areas.

Moreover hitherto known light sensitive materials comprising such sensitizing agents and resins are capable of being made less soluble by the sensitizing agents under the action of light have the disadvantage that on development of the image-wise exposed material, the light-struck areas (.e. the tanned areas) tend to swell even though they are not removed by the developer. Thus, they are not suitable for the preparation of half-tone printing plates.

It is an object of the instant invention to provide a presensitized plate comprising a storage stable light sensitive material coated on to a support, which material (i) can be developed, after image-wise exposure, without swelling of the light-struck areas of the material, and (ii) results in light-struck areas, after image-wise exposure and development, which are resistant to etching solutions. Thus this invention has, for its object, the provision of pressurized light sensitive plates which can be used to produce deep-etch half-tone printing plates capable of printing very many high quality copies.

According to the present invention, there is provided a presensitized light sensitive plate suitable for the production of a half-tone printing plate by the deep-etch process, which presensitized plate comprises a support coated with a layer of a light sensitive material comprising (i) a tannable resin selected from the group consisting of very low viscosity hydroxyethyl cellulose and water soluble polymers of acrylamide containing structural units derived from more than one monomer other than acrylamide, said polymers being characterized in that said structural units constitute up to 30 percent by weight of the polymers, and (ii) a light-sensitive diazo or azido compound having light-decomposition products which are capable of tanning the resin.

Generally, acrylamide polymers useful in the present invention form aqueous solutions having solids contents of 6 percent which have viscosities of from about 5 to 100 centistokes. Examples of preferred acrylamide polymers are co-polymers of propenoic acid/amide (i.e. copolymers of acrylic acid and acrylamide) modified by the introduction of carboxylate (e.g. acrylate) groups into the molecule. Such a modified copolymer may for example, consist of about 3.0 percent by weight of acrylic acid units and about 16.0 percent by weight of sodium acrylate units, the remainder of the copolymer consisting of acrylamide units. Other examples of polymers of acrylamide containing up to 30 percent by weight of other monomers which may be used in accordance with the present invention are copolymers of acrylamide with, as comonomers, compounds selected from the group consisting of acrylic and methacrylic acids, acrylic and methacrylic acid esters with alcohols containing up to four carbon atoms, acrylonitrile and methacrylonitrile, N-substituted acrylamides and methacrylamides, vinyl pyrollidone and vinyl esters, such as vinyl acetate and vinyl propionate. The comonomers are selected so that on the one hand the resultant acrylamide copolymer is soluble in developer liquids and, on the other hand, the tanned copolymer is resistant to swelling by the developer liquids. For example, the presence in the acrylamide polymers of structural units derived from acrylonitrile, methacrylonitrile, acrylic acid esters of alcohols containing up to four carbon atoms, methacrylic acid esters of alcohols containing up to four carbon atoms, and vinyl esters, is particularly preferred since these monomers confer on the resultant tannable resin the properties of good resistance to swelling by water and thus by suitably selecting the proportions of such monomers in accordance with the present invention it is possible to obtain acrylamide polymers which on the one hand are water-developable but which on the other hand form light hardened products which do not swell during the water development.

The tannable resins used in accordance with the present invention have viscosities commensurate with molecular weight which are such that the resins have an average chain length which, on the one hand, is such that the resins are resistant to chemical attack by conventional etchants and, on the other hand, is such that the resins are developable i.e. they are soluble in liquids which will not dissolve the tanned resins. Moreover, the lower the molecular weight of the tannable resins, the more resin can be dissolved in a suitable liquid to give a solution of a given viscosity. Hence, low molecular weight resins are preferred since they provide a more massive dried coating on the support for a coating solution of given viscosity. It has been found that copolymers having a molecular weight such that the viscosity of an aqueous solution of the copolymer of between about 4 and 10 percent solids content is between about 10 and about 50 centistokes are particularly suitable. A particularly preferred polymer of acrylamide for use in the present invention is a copolymer of acrylamide with acrylonitrile and acrylic acid containing from 10 to 20 percent by weight (preferably 13 to 15 percent by weight) of structural units derived from acrylonitrile and up to 20 percent by weight (preferably up to 17 percent by weight) of structural units derived from acrylic acid. The presence of the acrylonitrile in the copolymer greatly improves the resistance of the tanned polymer to swelling by water during development.

Suitable light-sensitive diazo or azido compounds are those possessing a fairly large molecule and which are soluble and have light-decomposition products which are capable of tanning the resin. Examples of such compounds are 4-diazodiphenylamine sulphate, the condensation product of 4-diazodiphenylamine sulphate and paraformaldehyde in sulphuric acid, the zinc chloride salt of the condensation product of 4-diazo-diphenylamine and paraformaldehyde in sulphuric acid, 4,4′-diazidostilbene-2:2′-disulphonic acid, 4-azido-benzal-mesityl oxide 2-sulphonic acid salts and 4-azido-benzal-acetone 2-sulphonic acid salts.

The support used for the plates of the present invention is quite conventional and is preferably of aluminum having an anodized surface.

The light sensitive materials used in accordance with the present invention are storage stable. Thus, the presensitized plates of the present invention can be stored for considerable periods before use. Moreover, the light struck ares of the light sensitive material obtained on image-wise exposure of the plates do not swell during development with water to remove the non-light struck areas. Further, the stencil constituted by the light struck areas remaining on the support after development are resistant to the etchants conventionally used to etch the support.

The speed of the decomposition of the diazo or azido compound and of the reaction converting the tannable resin to an insoluble form is often too efficient and unfortunately results in exposure times which would not be acceptable in practice as they would give the platemaker little latitude to deal with positives of poor quality such as are found in normal practice. In order to overcome this problem, it is preferred to introduce into the light sensitive material a substance which has a strong absorption spectra in the 2,700 to 4,000 Angstrom region at least. Such a substance slows down the reaction by acting as a competitor for the actinic radiation used during the image-wise exposure as the diazo and azido compounds used also strongly absorb radiation in the region between 2,700 to 4,000 Angstroms. Several substances are suitable for this purpose, including chromium and copper compounds, benzophenone and many derivatives of benzophenone and salicylic acid which have known ultra violet light absorption characteristics. The most efficient substance for this purpose is the yellow dye Auramine although chrysoidine and tartrazine also act in a similar manner.

In a preferred method of producing the presensitized light sensitive plates of the invention, a sheet of aluminum or aluminum alloy is electrochemically or mechanically roughened (grained) and thereafter anodized. The anodizing may be carried out using phosphoric acid or sulphuric acid. An aqueous solution of the light sensitive material comprising the tannable resin sensitized with the diazo or azido compound is then applied evenly over the anodized surface of the plate in a whirler and dried with warm air at a temperature of about 35°C. The resultant presensitized plate is then ready for storage or despatch. When the plate is required for use the printer has no need to prepare the plate, but simply exposes it under a positive to an ultra violet light rich source, such as a carbon arc or pulsed Xenon lamp. The further processing of the plate to produce a printing image is then carried out in accordance with the conventional "deep-etch" process. Thus, the non-light struck areas of the light sensitive material are selectively removed from the support surface using a developer which may vary in constitution from plain water to a strong solution of the mixed chlorides of calcium and zinc depending on the hardness of the light struck areas of the light sensitive material. There is thus obtained a stencil on the support consisting of the light struck areas of the light sensitive material. Because of the nature of the light sensitive material used in accordance with the invention the developer does not cause swelling of the light struck areas of the light sensitive material. After development the areas of the support surface revealed by removal of the non light-struck areas are etched, so that the surface in these areas is slightly dissolved away and made more receptive to the image lacquer to be subsequently applied. The etchant used is quite conventional and may contain calcium, iron, magnesium and/or zinc chloride together with free hydrochloric, hydrofluoric, silicofluoric and/or borofluoric acid. Because of the nature of the light sensitive material used in accordance with the invention, the stencil constituted by the light struck areas of the light sensitive material is resistant to the etchant used. Thus, etching occurs only in those areas of the support surface which were revealed on removal of the non-light struck areas of the light sensitive material during development. The etched plate is then washed to remove the etchant with dry alcohol or water after which the image lacquer is applied. The image lacquer may comprise, for example, a copolymer of vinyl chloride dissolved in a solvent and is chosen for its hard wearing properties, adhesion to the etched support surface and resistance to printing ink solvents. After the image lacquer has dried a developing ink can be rubbed over the plate to make the lacquer etched areas i.e. the printing image more visible and finally the stencil is soaked in water and scrubbed off. Those areas of the support surface revealed when the stencil is removed constitute the non-printng areas. It is often beneficial to use 5 percent w/v citric acid or 1 percent v/v to 2 percent v/v sulphuric acid to remove the stencil to ensure that the non-printing areas are clean. Descumming should not be required. Typical formulations suitable for use in the deep-etch process are described in the appendix of "Offset plate-making Deep-Etch Processes," Lithographic Technical Foundation Publication No. 504, pages 213 et seq and in "Lithographic Technical Foundation Formulary," pages 37 to 40.

The following examples illustrate the present invention, all percentages being by weight unless otherwise stated.

EXAMPLE 1

A grained and sulphuric acid anodized aluminum sheet was coated with an aqueous solution comprising 10 percent of modified co-polymer of propenoic acid and its amide of relatively low molecular weight and 1 percent of the water-soluble condensation product of paraformaldehyde and 4-diazo diphenylamine. The modified copolymer used was that known under the designation P26 of the American Cyanamid Company. This modified copolymer has a molecular weight of about 200,000 and consists of about 3 percent by weight of acrylic acid units and about 16 percent by weight of sodium acrylate units, the remainder being acrylamide units. The light sensitive plate thus obtained was storage stable. After exposure under a photographic positive the untanned areas of the light sensitive coating were removed from the plate by swabbing with water. No swelling of the tanned areas of the coating occurred. The normal procedure for producing a deep-etch plate was then carried out. The resist constituted by the tanned areas was unaffected by the etchant. The tanned areas were finally removed from the sheet using 1 percent v/v sulphuric acid.

EXAMPLE 2

A cleaned and electrolytically grained aluminum plate was anodized in a 25 percent w/v phosphoric acid bath and then whirler coated with a light sensitive aqueous solution comprising 0.54 percent of Auramine O powder, 5.8 percent of acrylamide/acrylonitrile/acrylic acid terpolymer, 4 percent of industrial alcohol 74 over proof grade, and 0.36 percent of the water soluble condensation product of p-diazodiphenylamine-sulphate and formaldehyde obtained from the Andrews Corporation of America. The molecular weight of the terpolymer was such that the viscosity of a 4 to 10 percent solids aqueous solution was 50/100 centistokes and it consisted of 13 percent by weight of acrylonitrile units, 10 percent by weight of acrylic acid units and 77 percent by weight of acrylamide units.

The coating was then dried and exposed under a positive to light from a 50 amp carbon arc at a distance of three feet for four minutes. The untanned areas of the coating were removed from the plate by swabbing with a 2 percent solution of acetic acid, followed by washing of the plate with water. Alternatively, the untanned areas of the coating could be removed by spraying with water. The normal procedure for producing a deep-etch plate was then carried out using an etchant comprising zinc, magnesium and ferric chlorides and hydrochloric acid and finally the tanned areas were removed with scrubbing using 2 percent v/v sulphuric acid. The tanned areas did not swell during development and were resistant to the etchant used.

EXAMPLE 3

A sheet of aluminum was cleaned, electrolytically grained and then anodized in a 15 percent v/v sulphuric acid bath. The anodized plate was coated with an aqueous solution comprising 8 percent of low viscosity hydroxyethyl cellulose, 0.4 percent of 4,4′-diazido stilbene-2:2′-disulphonic acid and 0.1 percent of Lissamine Rhodamine B500. The word "Lissamine" is a Trade Mark. The dyestuff is added to achieve a better contrast of the developed image. The hydroxyethyl cellulose had a viscosity of 100–120 centipoises when dissolved in a 10 percent solution in water.

The coated plate was then dried and exposed for 2½ minutes under a positive to the light from the 50 amp carbon arc at a distance of 3 feet.

The untanned areas of the coating were removed from the plate by swabbing with an aqueous solution of calcium and zinc chlorides as hereinbefore described and then the normal procedure for producing a deep-etch plate was carried out using an etchant comprising zinc ferric and cupric chlorides and hydrochloric acid. A 2 percent v/v sulphuric acid solution in water was used to remove the tanned areas. The tanned areas did not swell during development and were resistant to the etchant used.

The Rhodamine dyestuff may be replaced by other dyestuffs to achieve better contrast, particularly disulphine blue AS (commercially available from Imperial Chemical Industries Limited) and Wasser Blau TBA (commercially available from Farbwerke Hoechst AG).

EXAMPLE 4

A sheet of aluminum was cleaned, by immersion for 8 minutes in a 6 percent w/v solution of sodium hydroxide. The sheet was then washed with water and immersed in a 0.5 percent w/v solution of hydrochloric acid at 30°C. and connected in an electrical circuit. An alternating current of density 5.0 amps per square decimeter was passed through the sheet for 6 minutes. This treatment roughened (or grained) the surface of the sheet. The sheet was washed and then immersed in a bath of a 10 percent v/v aqueous solution of orthophosphoric acid S.G. 1.75. The sheet was made the anode in an electrical circuit and a steel cathode was provided. Direct current at 30 volts was passed through the circuit for 8 minutes whilst the bath was maintained at a temperature of 25°C. The anodized sheet thus obtained was then washed, dried and coated with a solution comprising 360 ml water, 120 ml of the acrylamide terpolymer used in Example 2, 1.2 g of the potassium salt of 4-azido-benzal-mesityl oxide 2-sulphonic acid, and 0.05 g of the yellow dye tartrazine. The sheet was dried. The coated sheet was storage stable for a considerable period.

The coating on the sheet was exposed under a half-tone positive for 1 minute to light from a 4,000 watt pulsed xenon lamp at a distance of 2 feet. The exposed coating was developed with water to remove the the untanned areas and the aluminum surface revealed was etched using a conventional etchant comprising zinc chloride, magnesium chloride, ferric chloride and hydrochloric acid. The tanned areas of the coating did not swell during development and they were unaffected by the etchant. The etched plate was then well washed, dried and then lacquered using a conventional lacquer comprising a solution of a vinyl chloride/vinyl acetate copolymer in a ketone. The lacquered plate was then inked and the tanned areas of the coating were removed using 2 percent v/v sulphuric acid in the conventional manner. The resultant half-tone printing plate was capable of producing many satisfactory copies.

EXAMPLE 5

Example 4 was repeated but in this case the azido compound used was 4-azido-benzal-acetone 2-sulphonic acid potassium salt. Similar results were obtained.

EXAMPLE 6

A sheet of aluminum was cleaned, grained and anodized in the manner described in Example 4. The sheet was then coated with a solution comprising 340 ml water, 160 ml of the terpolymer used in Example 2, 1.6 g of the water-soluble product obtained by condensing 4-diazodiphenyl amine and paraformaldehyde in the presence of sulphuric acid and 2.0 ml of a 10 percent solution of the yellow dye chrysoidine G. The coated sheet was then dried and exposed for 1 minute under a half-tone positive to light from a 4,000 watt pulsed xenon lamp at a distance of 2 feet. The exposed coating was developed with water, washed, dried and then etched in a conventional manner using an etchant comprising hydrochloric acid and the chlorides of zinc, magnesium and iron. The tanned areas did not swell during development and were unaffected by the etchant. The etched plate was then washed with water, dried, lacquered with a vinyl chloride/vinyl acetate copolymer lacquer, and inked. Finally, the tanned areas were removed using 1 percent v/v sulphuric acid. The resultant half-tone printing plate was capable of printing many good copies.

We claim:

1. A presensitized light sensitive plate suitable for the production of a half-tone printing plate by the deep-etch process, which presensitized plate comprises a support coated with a layer of a light sensitive material comprising (i) a tannable resin which is a water soluble polymer containing at least 70 percent by weight of structural units derived from acrylamide and containing structural units derived from acrylonitrile or pound having light decomposition products which are capable of tanning the resin.

2. A presensitized light sensitive plate as claimed in claim 1, wherein said polymer contains up to 20 percent by weight of structural units derived from acrylic acid and wherein the structural units derived from acrylonitrile constitute from 10 to 20 percent by weight of the polymer.

3. A presensitized light sensitive plate as claimed in claim 2, wherein the structural units derived from acrylonitrile constitute from 13 to 15 percent by weight of the polymer.

4. A presensitized light sensitive plate as claimed in claim 1, wherein the diazo compound is 4-diazo-diphenylamine sulphate, the condensation product of 4-diazodiphenylamine sulphate and paraformaldehyde in sulphuric acid, or the zinc chloride salt of the condensation product of 4-diazo diphenylamine and paraformaldehyde.

5. A presensitized light sensitive plate as claimed in claim 1, wherein the azido compound is 4,4'-diazidostilbene-2,2'-disulphonic acid, a 4-azido-benzal-mesityl oxide 2-sulphonic acid salt, or a 4-azido-benzal-acetone 2-sulphonic acid salt.

6. A presensitized light sensitive plate as claimed in claim 1, wherein a substance having a strong absorption spectra in the 2,700 to 4,000 Angstrom region is included in the light sensitive layer.

7. A presensitized light sensitive plate as claimed in claim 6, wherein said substance is selected from the group consisting of auramine, chrysoidine and tartrazine.

8. Process for the production of a half-tone printing plate which comprises a. providing a presensitized light sensitive plate comprising a support coated with a layer of a light sensitive material comprising (i) a tannable resin which is a water soluble polymer containing at least 70 percent by weight of structural units derived from acrylamide and containing structural units derived from acrylonitrile or methacrylonitrile and (ii) a light sensitive diazo or azido compound having light decomposition products which are capable of tanning the resin, b. image-wise exposing the plate to a half-tone positive so that the coating includes light-struck areas and non-light-struck areas, c. developing the image-wise exposed plate with an aqueous developer selectively to remove the non-light-struck areas of the coating and reveal the surface of the support underlying those areas, d. etching the revealed surface of the support, e. applying an ink-receptive material to the etched support, and f. removing from the support the light-struck areas of the coating to obtain a half-tone printing plate comprising printing areas constituted by the ink-receptive material and non-printing areas constituted by the areas of the support surface revealed when the light-struck areas are removed.

* * * * *